US011517940B2

(12) United States Patent
Uozumi et al.

(10) Patent No.: US 11,517,940 B2
(45) Date of Patent: Dec. 6, 2022

(54) SUBSTRATE CLEANING DEVICE (71) Applicant: EBARA CORPORATION, Tokyo (JP)

(72) Inventors: Shuji Uozumi, Tokyo (JP); Yasuyuki Motoshima, Tokyo (JP); Toru Maruyama, Tokyo (JP)

(73) Assignee: EBARA CORPORATION, Tokyo (JP)

(*) Notice: Subject to any disclaimer, the term of this patent is extended or adjusted under 35 U.S.C. 154(b) by 398 days.

(21) Appl. No.: 16/713,000

(22) Filed: Dec. 13, 2019

(65) Prior Publication Data

US 2020/0188962 A1 Jun. 18, 2020

(30) Foreign Application Priority Data

Dec. 13, 2018 (JP) .............................. JP2018-233019

(51) Int. Cl.
*B08B 1/04* (2006.01)
*B08B 3/04* (2006.01)
*B08B 1/00* (2006.01)
*H01L 21/67* (2006.01)

(52) U.S. Cl.
CPC ................. *B08B 1/04* (2013.01); *B08B 3/04* (2013.01); *H01L 21/67046* (2013.01); *B08B 1/007* (2013.01)

(58) Field of Classification Search
CPC .. B08B 1/04; B08B 3/04; B08B 1/007; H01L 21/67046; F16C 33/76; F16C 33/7886; F16C 33/7896

USPC .......................................... 15/103.5; 384/624
See application file for complete search history.

(56) References Cited

U.S. PATENT DOCUMENTS

| 2,267,875 | A | * | 12/1941 | Reynolds | ............. F16C 23/084 |
| | | | | | 277/423 |
| 6,248,009 | B1 | * | 6/2001 | Ito | ......................... B08B 1/007 |
| | | | | | 451/443 |
| 2013/0068253 | A1 | * | 3/2013 | Gonzalez | ................. B08B 9/00 |
| | | | | | 134/21 |

FOREIGN PATENT DOCUMENTS

JP        2000301079        10/2000

* cited by examiner

*Primary Examiner* — Joseph J Hail
*Assistant Examiner* — Caleb Andrew Holizna
(74) *Attorney, Agent, or Firm* — JCIPRNET (57) ABSTRACT

A substrate cleaning device that facilitates control of the amount of liquid supplied to a substrate and reduces adverse influences of the liquid supplied to a bearing part on the substrate is provided. The substrate cleaning device includes: a holding part that has a bearing part configured to rotatably hold a cleaning member for cleaning a substrate; a first supply part that has at least a part provided inside the holding part and supplies a first liquid into the cleaning member through the inside of the holding part; and a second supply part that supplies a second liquid to the bearing part.

8 Claims, 10 Drawing Sheets

SUBSTRATE CLEANING DEVICE

CROSS-REFERENCE TO RELATED APPLICATION

This application claims the priority benefit of Japan application no. 2018-233019, filed on Dec. 13, 2018. The entirety of each of the above-mentioned patent applications is hereby incorporated by reference herein and made a part of this specification.

BACKGROUND

Technical Field

The present disclosure relates to a substrate cleaning device that includes a bearing part configured to rotatably hold a cleaning member.

Description of Related Art

The related art in which a cleaning member such as a roller is received using a bearing part and a cleaning solution is supplied to the bearing part is known. Patent Document 1 (Japanese Patent Laid-Open No. 2000-301079) discloses a substrate cleaning device that includes a substrate holding part configured to hold a substrate while rotating the substrate, a cleaning tool configured to perform cleaning by scrubbing a surface of the substrate to be cleaned, and a cleaning tool holding part configured to rotatably hold the cleaning tool around an axis thereof. In the substrate cleaning device, the cleaning tool has a shaft body and a cleaning member that is attached to the circumference of the shaft body and is able to distribute a cleaning solution. Also, a shaft hole extending in an axial direction and a cleaning solution ejection port that penetrates therethrough in a radial direction from the shaft hole are formed in the shaft body, and a fluid lubrication bearing that uses the cleaning solution as a lubrication fluid is formed at one end between the shaft body and the cleaning tool holding part.

In a case in which a part of a cleaning solution is used for lubrication of the bearing as in an aspect disclosed in Patent Document 1, the amount of cleaning solution provided to the substrate is not quantitative, and also, there may be problems due to leakage of the cleaning solution supplied to the bearing.

The present disclosure provides a substrate cleaning device that facilitates control of the amount of liquid supplied to a substrate and reduces adverse influences of the liquid supplied to the bearing part on the substrate.

SUMMARY

According to an embodiment of the disclosure, a substrate cleaning device may include: a holding part that has a bearing part configured to rotatably hold a cleaning member for cleaning a substrate; a first supply part that has at least a part provided inside the holding part and supplies a first liquid into the cleaning member through the inside of the holding part; and a second supply part that supplies a second liquid to the bearing part.

BRIEF DESCRIPTION OF THE DRAWINGS

FIG. 8($a$) is a diagram of a first tightly closed part that can be used in the embodiment of the disclosure when seen in an axial direction of the cleaning member, FIG. 8($b$) is a diagram of a second tightly closed part that can be used in the embodiment of the disclosure when seen in the axial direction of the cleaning member, and FIG. 8($c$) is a diagram of the first tightly closed part and the second tightly closed part that can be used in the embodiment of the disclosure in an overlapped state when seen in the axial direction of the cleaning member.

FIG. 9($a$) is a diagram of a bearing part that can be used in the embodiment of the disclosure when seen in the axial direction of the cleaning member, and FIG. 9($b$) is a diagram illustrating the bearing part, the first tightly closed part and the second tightly closed part that can be used in the embodiment of the disclosure in a overlapped state when seen in the axial direction of the cleaning member.

DESCRIPTION OF THE EMBODIMENTS

Embodiment

<<Configuration>>

An embodiment of a substrate treatment device that includes a substrate cleaning device and the like will be described.

Figure 10:
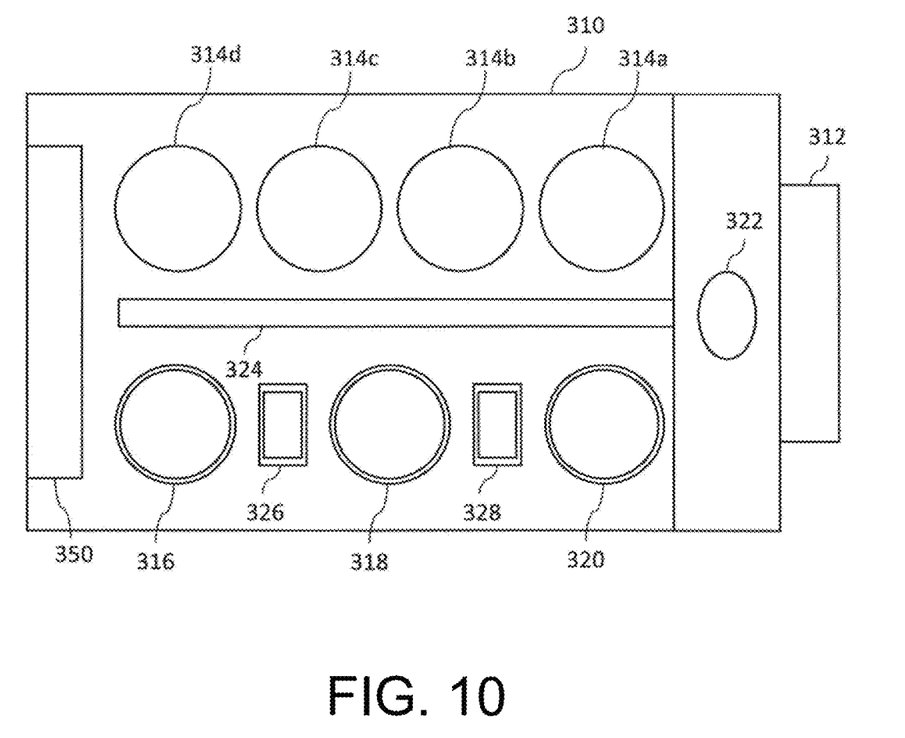
FIG. 10 is an outline plan view illustrating an overall configuration of a treatment device that includes a substrate treatment device according to the embodiment of the disclosure.

As illustrated in FIG. 10, the substrate treatment device according to the embodiment has a substantially rectangular housing 310 and a load port 312 on which a substrate cassette for stocking a large number of substrates W is placed. The load port 312 is disposed so as to be adjacent to the housing 310. On the load port 312, an open cassette, a standard mechanical interface (SMIF) pod, or a front opening unified pod (FOUP) can be mounted. The SMIF pod or the FOUP is a tightly closed container that can keep an environment independently from that of an outer space by accommodating the substrate cassette therein and covering the substrate cassette with a partition wall. As the substrates W, semiconductor wafers and the like can be exemplified, for example.

Inside the housing 310, a plurality of (four in the aspect illustrated in FIG. 10) polishing units 314$a$ to 314$d$, a first cleaning unit 316 and a second cleaning unit 318 configured to clean the substrates W after polishing, and a drying unit 320 configured to dry the substrates W after cleaning are accommodated. The polishing units 314$a$ to 314$d$ are aligned in the longitudinal direction of the substrate treatment device, and the cleaning units 316 and 318 and the drying unit 320 are also aligned in the longitudinal direction of the substrate treatment device. According to the substrate treatment device in the embodiment, it is possible to perform polishing treatment on various substrates W in a process for manufacturing a magnetic film in a semiconductor wafer, a flat panel, an image sensor such as a complementary metal oxide semiconductor (CMOS) or a charge coupled device (CCD), or a magnetoresistive random access memory (MRAM) with a diameter of 300 mm or 450 mm. Also, a substrate treatment device according to another embodiment may be a device that does not include the polishing units for polishing the substrates W in the housing 310 and performs a cleaning treatment and drying treatment on the substrates W.

A first transport robot 322 is disposed in a region surrounded by the load port 312, the polishing unit 314a located on the side of the load port 312, and the drying unit 320. Also, a transport unit 324 is disposed parallel to the polishing units 314a to 314d, the cleaning units 316 and 318, and the drying unit 320. The first transport robot 322 receives the substrates W before polishing from the load port 312 and passes the substrates W to the transport unit 324, and receives the substrates W after drying taken out of the drying unit 320 from the transport unit 324.

A second transport robot 326 that receives and passes the substrates W between the first cleaning unit 316 and the second cleaning unit 318 is disposed between the first cleaning unit 316 and the second cleaning unit 318, and a third transport robot 328 that receives and passes the substrates W between the second cleaning unit 318 and the drying unit 320 is disposed between the second cleaning unit 318 and the drying unit 320. Further, an overall control part 350 included in a control part that controls motion of the respective machines in the substrate treatment device is disposed inside the housing 310. Although the embodiment will be described using an aspect in which the overall control part 350 is disposed inside the housing 310, the disclosure is not limited thereto, and the overall control part 350 may be disposed outside the housing 310, or the overall control part 350 may be provided at a remote location.

As the first cleaning unit 316, a roller cleaning device that brings a roller cleaning member linearly extending over the substantially entire length of the diameter of each substrate W into contact with the substrate W in the presence of a cleaning solution, causes the roller cleaning member to spin about a central axis that is parallel to the substrate W, and performs cleaning by scrubbing the surface of the substrate W may be used. For example, a cleaning treatment may be performed by horizontally or vertically holding the substrate W, rotating the substrate W, and bringing the roller cleaning member into contact with the substrate W. Also, as the second cleaning unit 318, a pencil cleaning device that brings a contact surface of a columnar pencil cleaning member extending in the vertical direction into contact with the substrate W in the presence of a cleaning solution, causing the pencil cleaning member to spin and move in one direction, and performing cleaning by scrubbing the surface of the substrate W may be used. Also, as the drying unit 320, a spinning drying unit that ejects IPA vapor from a moving ejection nozzle toward the rotating substrate W that is horizontally held to dry the substrate W and causes the substrate W to further rotate at a high speed to dry the substrate W using a centrifugal force may be used.

Also, instead of the roller cleaning device, a pencil cleaning device that is similar to the second cleaning unit 318 may be used, or a two-fluid jet cleaning device that cleans the surface of the substrate W using a two-fluid jet may be used as the first cleaning unit 316. Also, instead of the pencil cleaning device, a roller cleaning device that is similar to the first cleaning unit 316 may be used, or a two-fluid jet cleaning device that cleans the surface of the substrate W using a two-fluid jet may be used as the second cleaning unit 318.

The cleaning solution in the embodiment includes chemicals such as a rinse solution such as pure water (DIW), ammonia hydrogen peroxide (SC1), hydrochloric acid hydrogen peroxide (SC2), sulfuric acid hydrogen peroxide (SPM), a sulfuric acid-hydrogen peroxide water mixture, or fluorine. In the embodiment, the cleaning solution means a rinse solution, a chemical, or both the rinse solution and the chemical unless particularly indicated otherwise.

Figure 1:
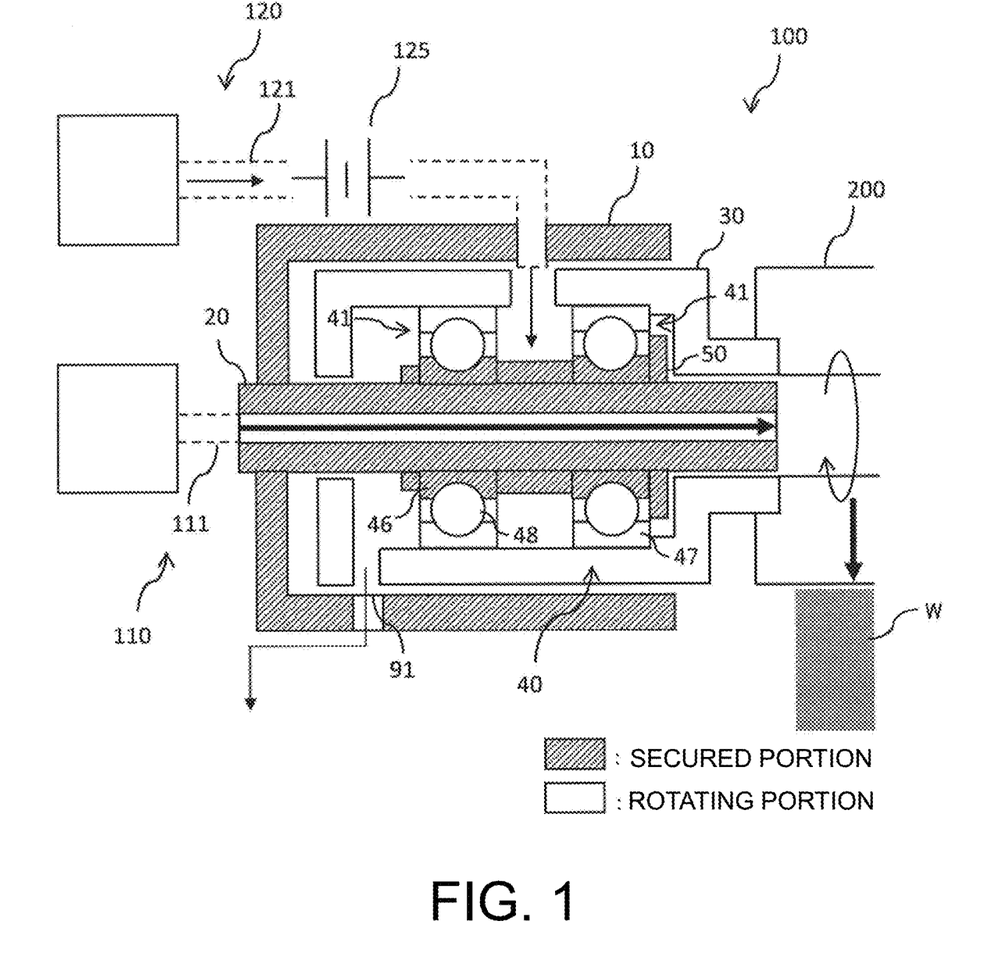
FIG. 1 is an outline side sectional view illustrating a configuration of a substrate cleaning device that can be used in an embodiment of the disclosure.

As illustrated in FIG. 1, the substrate treatment device according to the embodiment may have a holding part 100 that has a bearing part 40 configured to rotatably hold a cleaning member 200 for cleaning the substrates W, a first supply part 110 that supplies a first liquid into the cleaning member 200, and a second supply part 120 that supplies a second liquid to the bearing part 40. The first liquid is typically an inner rinse solution and for example, may be pure water. The second liquid is typically a bearing lubrication liquid that is used for lubrication of the bearing, and for example, may be pure water. The first liquid and the second liquid may be the same liquid or may be different kinds of liquid. In addition, it is also possible to use a chemical as the first liquid and to use a chemical as the second liquid as well. Although the following description will be provided on the assumption that a roller cleaning member is used as the cleaning member 200, the disclosure is not limited thereto, and it is also possible to employ the aspect of the embodiment to a pencil cleaning member.

One end of the cleaning member 200 that is a roller cleaning member may be held in a driven manner with respect to the holding part 100, and the other end thereof may be driven by a drive part (not illustrated) provided with a motor. A liquid such as DIW for cooling the motor of the driving part may be used as the second liquid. In this case, it is not necessary to additionally provide a mechanism for supplying the liquid, which is advantageous. The drive part may be provided in a tightly closed space isolated from a space for treating the substrates W, and the space may be a space to which oil or the like is also supplied. The bearing part on the side of the drive part may be made of metal or the like.

Figure 9A:
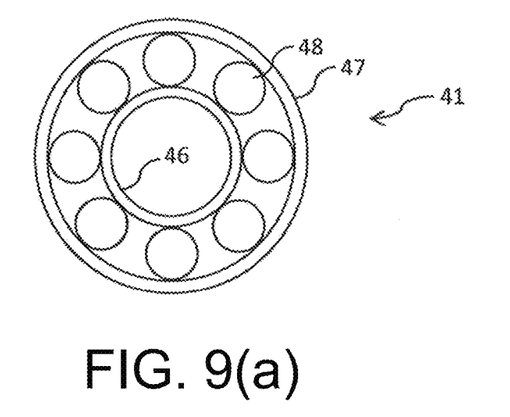

The bearing part 40 on the driven side illustrated in FIG. 1 may have two or more bearing members 41 (see FIG. 9(a)) provided in the axial direction. The second supply part 120 may supply the second liquid between the bearing members 41 in the axial direction. The second supply part 120 may have a second supply pipe 121 through which the second liquid flows. In addition, the "axial direction" in the present application means the axial direction of the cleaning member 200 and the left-right direction in FIGS. 2 and 5 unless particularly indicated otherwise.

Figure 3:
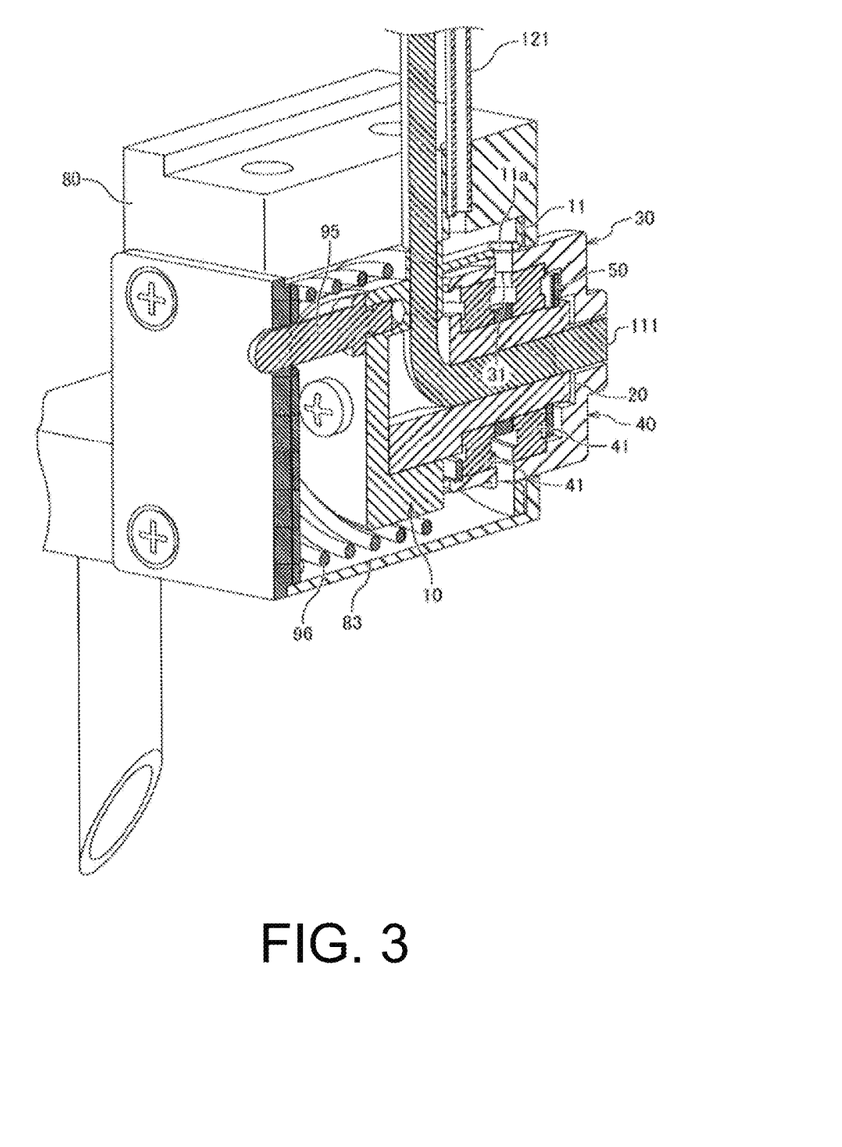
FIG. 3 is a perspective view of the holding part that can be used in the embodiment of the disclosure when seen obliquely from above on a side opposite to a cleaning member.
Figure 4:
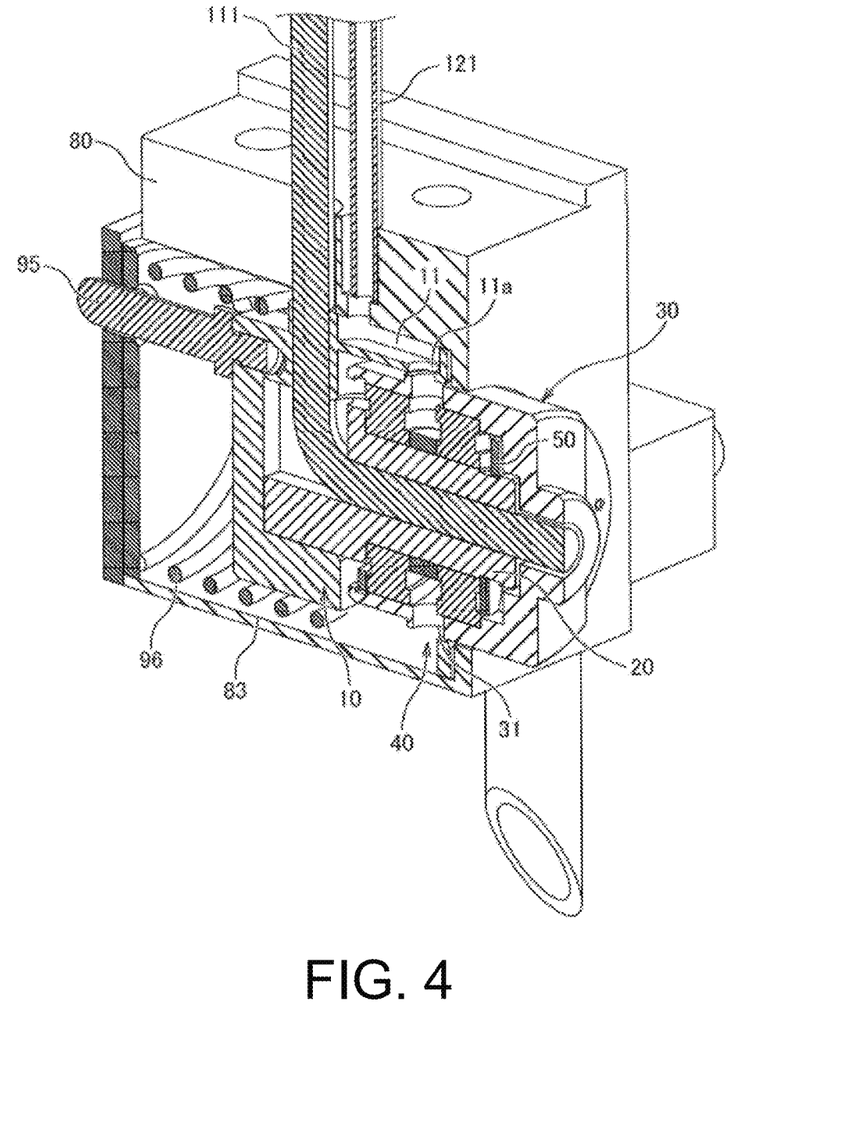
FIG. 4 is a perspective view of the holding part that can be used in the embodiment of the disclosure when seen obliquely from above on a side of the cleaning member.

As illustrated in FIGS. 3 and 4, a temporary withholding part 11 that temporarily withholds the second liquid above a rotation part 30 may be provided. The temporary withholding part 11 may be provided in (inside) an outer member 10, which will be described later. An outlet of the second supply pipe 121 is continuous with the supply hole 11a through the temporary withholding part 11 that is formed in the outer member 10 as a communication space.

As illustrated in FIG. 1, the holding part 100 may have the rotation part 30 (see FIG. 6) that rotates along with the cleaning member 200 and the outer member 10 provided at an outer circumference of the rotation part 30. An outer circumferential surface of the bearing part 40 may abut on an inner circumferential surface of the rotation part 30. An end of the rotation part 30 may be inserted into and secured to the cleaning member 200. An inner circumferential surface of the bearing part 40 may abut on an inner member 20, and the bearing part 40 may rotatably and axially support the rotation part 30 with respect to the inner member 20. A gap between the inner member 20 and the rotation part 30 may be as significantly narrow as about 0.25 mm. The small gap between the inner member 20 and the rotation part 30 as described above is advantageous in that it allows reduction in a risk of the second liquid leaking from the bearing part 40 coming into contact with the substrate W. However, the disclosure is not limited thereto, and the gap between the inner member 20 and the rotation part 30 may be about 1.00 mm.

The first supply part 110 may have a first supply pipe 111 that supplies the first liquid into the cleaning member 200. The first supply pipe 111 may be provided so as to pass through the outer member 10 and the inner member 20, with no disconnection being present between the bearing part 40 and the rotation part 30, and the first supply pipe 111 may extend up to the inside of the rotation part 30 and reach an end of the cleaning member 200. In addition, "secured portion" represented by hatching, and "rotating portion" represented as outlined white parts, are shown as individual portions in FIG. 1. However, although the first supply part 110, the second supply part 120, the first supply pipe 111, the second supply pipe 121, and an adjustment part 125, which will be described later, are represented by outlined white parts in FIG. 1, these components are secured and do not rotate.

An aspect in which the second supply part 120 supplies the second liquid to the bearing part 40 even when the first supply part 110 does not supply the first liquid into the cleaning member 200 may also be employed. Such control may be performed by a control part such as the overall control part 350.

Figure 5:
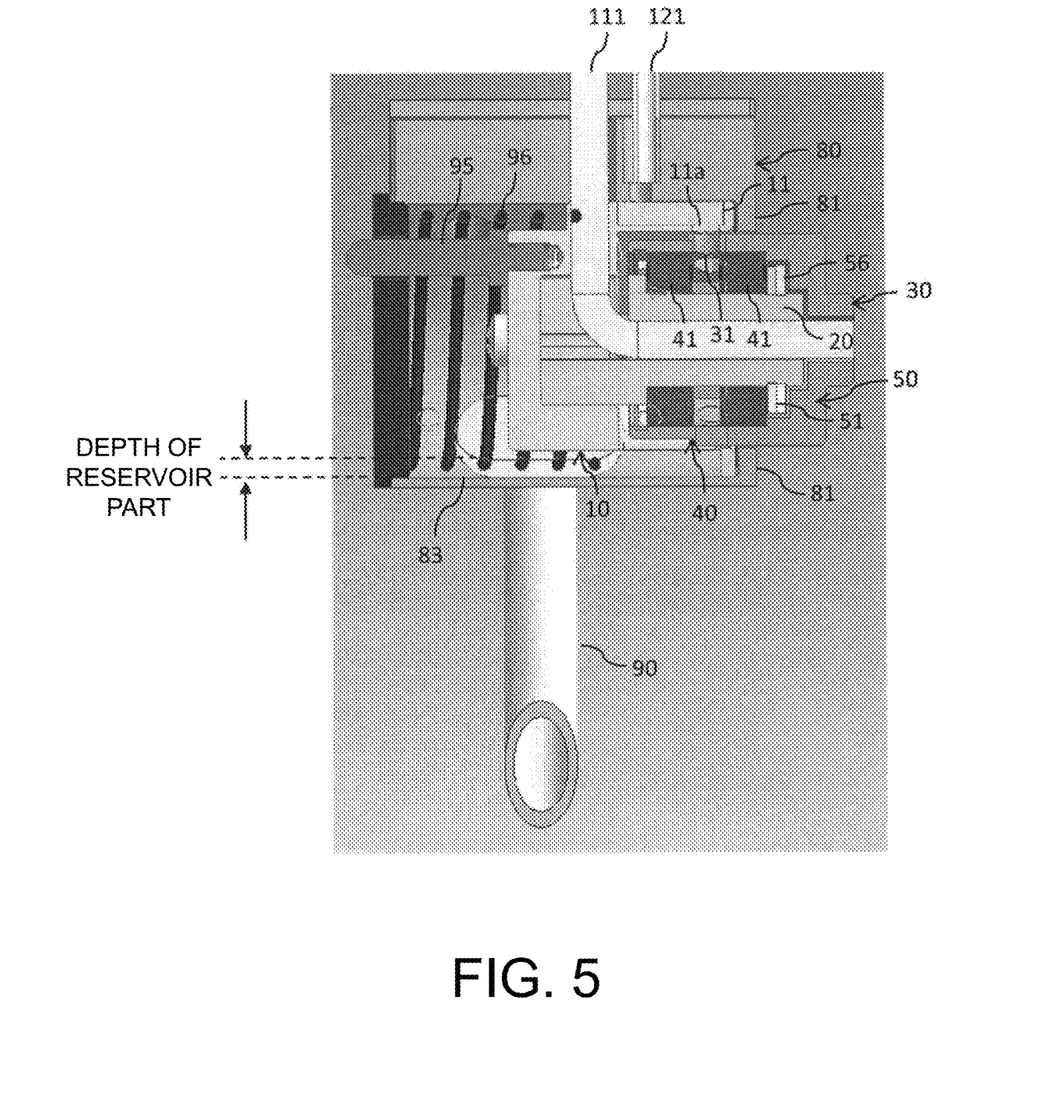
FIG. 5 is a side sectional view of the holding part that can be used in the embodiment of the disclosure.
Figure 6:
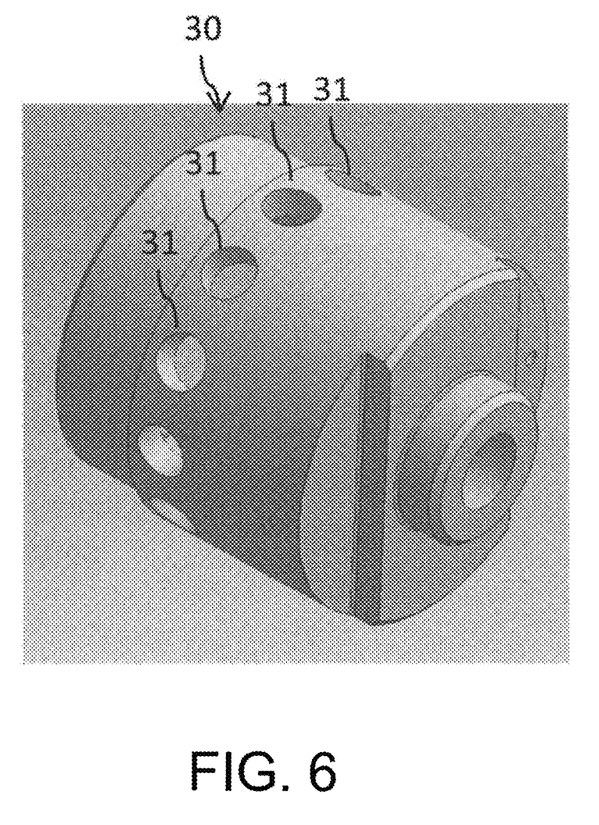
FIG. 6 is a perspective view of a rotation part that can be used in the embodiment of the disclosure.

As illustrated in FIG. 6, one or more holes 31 that rotate along with the cleaning member 200 and supply the second liquid to the bearing part 40 may be provided in the rotation part 30. Only one hole 31 may be provided, or a plurality of holes 31 may be provided. All the holes 31 may be positioned between the bearing members 41 in the axial direction (see FIG. 5). The holes 31 may be provided such that the size thereof corresponds to the gap between the bearing members 41. Here, the description that the size of the holes 31 corresponds to the gap between the bearing members 41 means that the diameter R of the holes 31 is equal to or greater than 90% and equal to or less than 100% of a gap D between the bearing members 41 and means D×0.9≤R≤D. By the holes 31 being provided between the bearing members 41 in the axial direction, it is possible to prevent the second liquid falling from the holes 31 from splashing due to the rotating bearing members 41 and leaking to the side of the substrates W. That is, if the holes 31 are provided at positions at which the holes 31 overlap the bearing members 41 in the axial direction, there is a probability that the second liquid falling on the bearing member 41 will splash on the rotating bearing members 41 and leak to the side of the substrates W. However, it is possible to reduce such a probability according to this aspect.

The case body 80 may be provided outside the outer member 10. A space may be provided between the case body 80 and the outer member 10, and a gap on the lower side (the lower side in FIG. 5) may be larger than a gap on the upper side (the upper side in FIG. 5) between the case body 80 and the outer member 10. A securing part 95 such as a securing bar for securing the outer member 10 may be provided on the case body 80. An elastic member 96 such as a spring may be provided between the case body 80 and the outer member 10, and the holding part 100 may be able to move in the axial direction when the cleaning member 200 is attached to the holding part 100.

A barrier 81 may be provided on the case body 80 on the side of the substrates W, and the weir 81 may be provided to face the surface (the surface on the right side in FIG. 5) of the outer member 10 on the side of the cleaning member 200. In this case, it is possible to prevent, due to the barrier 81, the second liquid from improperly leaking to the side of the substrate W.

Figure 7:
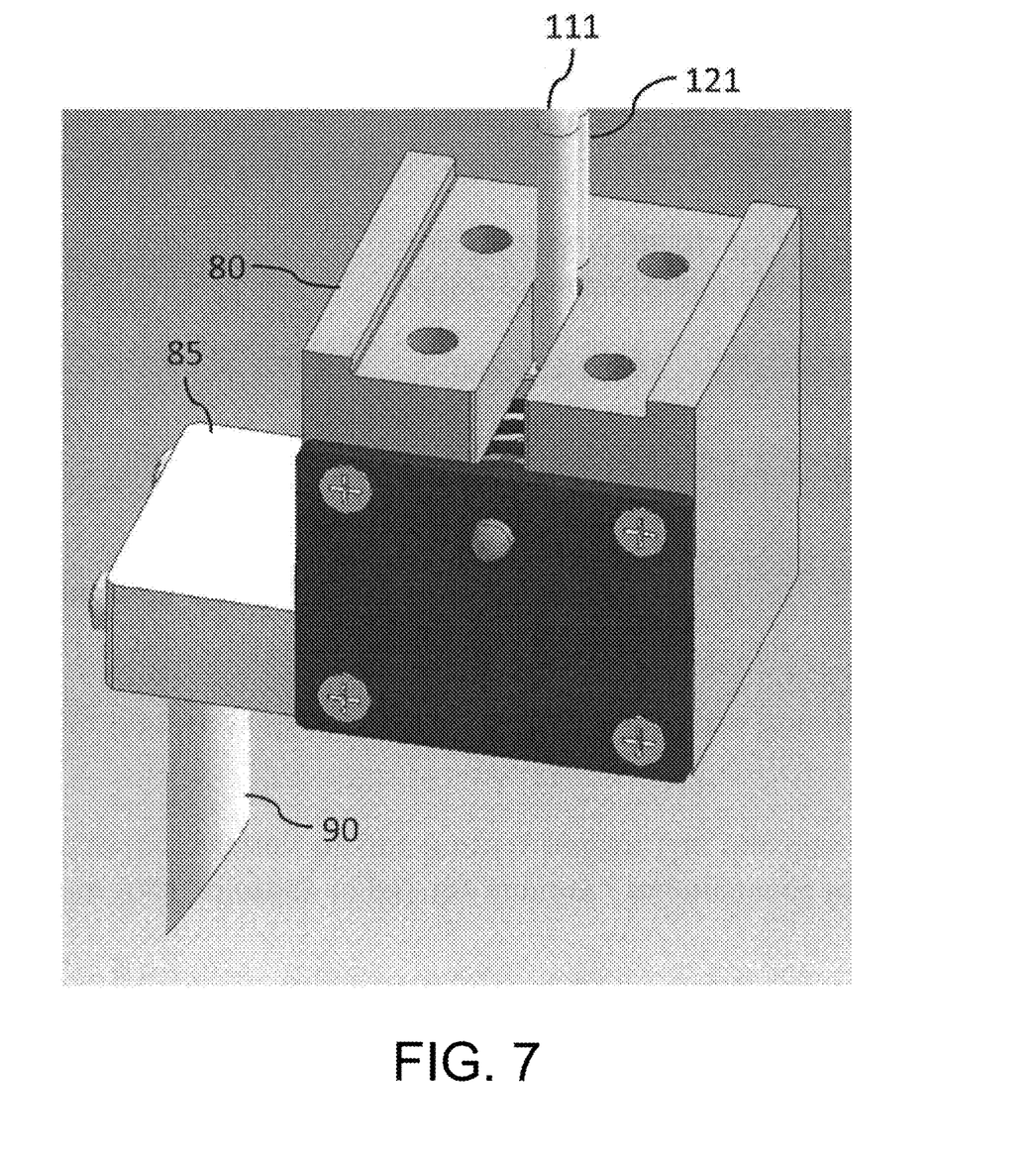
FIG. 7 is a perspective view of a case body that can be used in the embodiment of the disclosure.

As illustrated in FIG. 5, the holding part 100 may have a reservoir part 83 for storing the second liquid. The reservoir part 83 may be provided on a bottom surface of the case body 80. As illustrated in FIG. 7, a box part 85 may be provided on the case body 80 of the holding part 100, and a discharge part 90 made of a discharge pipe or the like having a discharge port 91 (see FIG. 1) for discharging the second liquid may be provided on the box part 85. In this case, the reservoir part 83 is formed on the bottom surface of the case body 80 with the height position of the bottom surface of the case body 80 and the height position of the box part 85 deviating from each other in the height direction (see FIG. 5). In addition, the disclosure is not limited to such an aspect, and the discharge part 90 made of a discharge pipe or the like may be provided on the bottom surface of the case body 80.

Flowing of the second liquid to the side of the cleaning member (the right side in FIG. 5) may be further prevented by providing a double barrier in addition to the barrier 81 below the case body 80 or further providing an inclined part below the case body 80.

As illustrated in FIG. 1, the second supply part 120 may have an adjustment part 125 such as an orifice for adjusting the flow rate. The adjustment performed by the adjustment part 125 may be changed in accordance with a rotation speed of the cleaning member 200. The amount of the second liquid supplied may increase as the rotation speed of the cleaning member 200 increases, and the amount of second liquid supplied in a case of a first rotation speed may be larger than the amount of second liquid supplied in a case of a second rotation speed (first rotation speed>second rotation speed). Also, the amount Q of second liquid supplied=A× the rotation speed R of the cleaning member 200+B ("A" and "B" are predetermined constants), and the amount Q of second liquid supplied and the rotation speed R of the cleaning member 200 may have a linear function-like relationship. The amount of second liquid supplied may be, for example, 10 to 50 mm/minute.

As illustrated in FIG. 5, a tightly closed part 50 may be provided so as to surround a part or an entirety of an outer circumference of the inner member 20 surrounding the first supply pipe 111 for supplying the first liquid. The tightly closed part 50 may be disposed to face the bearing part 40. No member may be provided between the tightly closed part 50 and the bearing part 40.

Figure 8A:
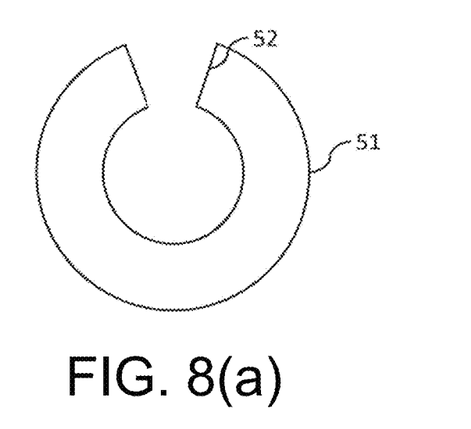
Figure 8B:
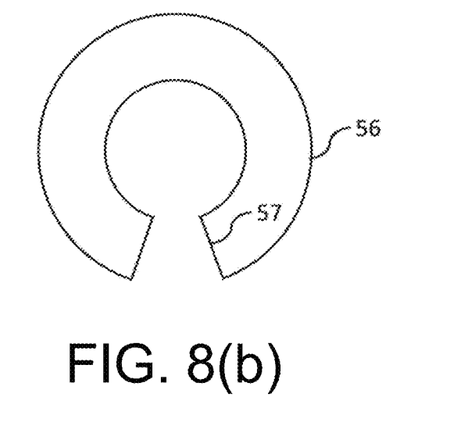
Figure 8C:
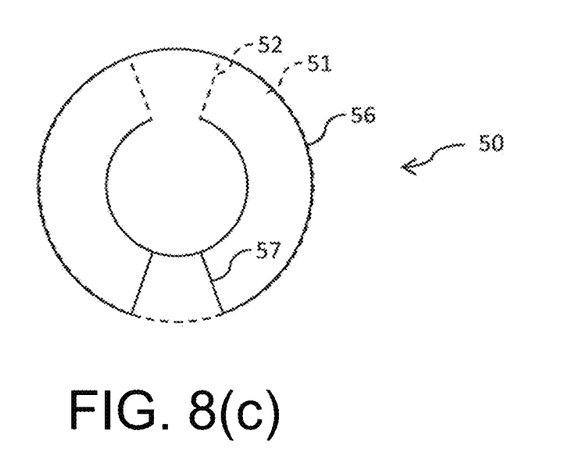

As illustrated in FIG. 8(a) to FIG. 8(c), the tightly closed part 50 may have a first tightly closed part 51 provided with a first notch 52 and a second tightly closed part 56 provided with a second notch 57. The second tightly closed part 56 is provided so as to be adjacent to the first tightly closed part 51, and these may be in plane contact with each other. In the aspect illustrated in FIG. 5, the second tightly closed part 56 is provided so as to be adjacent to the first tightly closed part 51 on the side of the cleaning member 200 (the right side in FIG. 5). An aspect in which the first notch 52 and the second notch 57 do not overlap each other when seen in the axial direction (the left-right direction in FIG. 5) of the cleaning member 200 may be employed, or the first notch 52 and the second notch 57 may be point-symmetric with respect to the axis of the cleaning member 200 as illustrated in FIG. 8(*c*).

Figure 9B:
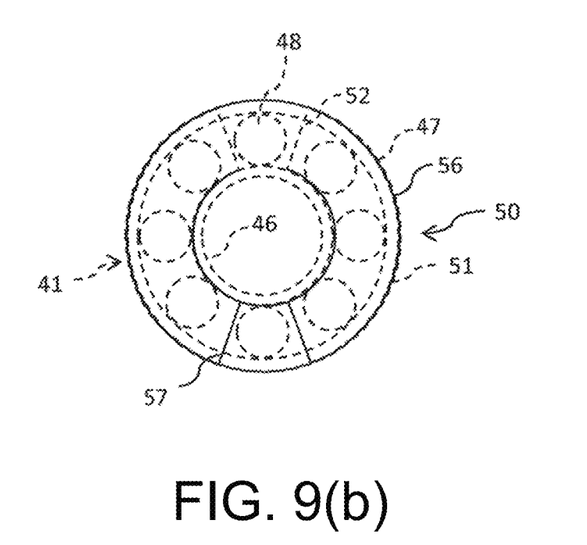

As illustrated in FIG. 9(*a*), the bearing part 40 may have a bearing securing part 46, a bearing rotation part 47 provided outside a peripheral edge of the bearing securing part 46 and a bearing ball 48 provided between the bearing securing part 46 and the bearing rotation part 47. As illustrated in FIG. 9(*b*), a circumferential edge outer end of the tightly closed part 50 may be located further outward at the circumferential edge than a circumferential edge outer end of the bearing ball 48 in the plane with a normal line in the axial direction (in the paper plane of FIG. 9(*b*)). However, the disclosure is not limited to such an aspect, and the circumferential edge outer end of the tightly closed part 50 may be located at the same position as that of the circumferential edge outer end of the bearing ball 48 or may be located further inward at the circumferential edge than the circumferential edge outer end of the bearing ball 48. A material of the bearing member 41 and the bearing ball 48 may be SiC, for example. In a case in which the bearing part 40 is made of SiC in this manner, a film is formed by a liquid such as a second liquid wetting the surface, and the film exhibits a function as a lubricant and can exhibit a low friction function.

Although the cleaning member 200 may be provided so as to horizontally extend, the disclosure is not limited thereto, and the cleaning member 200 may be provided so as to vertically extend or may be provided so as to extend in an oblique direction between the horizontal direction and the vertical direction.

<<Effects>>

Next, effects of the embodiment configured as described above which have not yet been described will mainly be described. Even in a case in which there is no description in "Configuration", all components described in "Effects" can be employed in the disclosure.

In a case in which the aspect in which the first supply part 110 that supplies the first liquid into the cleaning member 200 and the second supply part 120 that supplies the second liquid to the bearing part 40 are included s illustrated in FIG. 1 and the like is employed, it is possible to supply a constant amount of first liquid and to lubricate the bearing part 40 with the second liquid. That is, although there is a probability that the amount of liquid used for lubricating the bearing part 40 is affected and the amount of liquid supplied to the substrates W varies in a case in which the bearing part 40 is lubricated using a liquid supplied to the substrates W without dividing the first liquid and the second liquid, it is possible to minimize such a probability according to the embodiment. When an aspect in which the control part such as the overall control part 350 controls the amount of first liquid supplied is employed, in particular, it is possible to control the amount of first liquid supplied to the substrates W to an accurate value and thus to prevent the substrates W such as wafers from being adversely affected.

In a case in which a part of the cleaning solution is used for lubricating the bearing part as in the aspect disclosed in Patent Document 1, the amount of cleaning solution flowing out of the gap may be approximately double of the amount of cleaning solution supplied to the substrates, and there is a problem that the amount of cleaning solution supplied to the substrates cannot be controlled. In one example in which the cleaning solution is supplied at 450 mm/minute, only 150 mm/minute may be used for cleaning the substrates, 300 mm/minute may be used for lubricating the bearing part in some cases, and the amount of cleaning solution supplied to the substrates cannot be controlled. Also, 450 mm/minute is just an example of the amount of first liquid supplied, and for example, the amount of first liquid supplied may be a larger amount such as 600 mm/minute or 800 mm/minute, or on the contrary, the amount of first liquid supplied may be an amount that is smaller than 450 mm/minute.

Also, since there are individual differences in the respective members that configure the holding part, there is a problem that it is not possible to control the amount of cleaning solution to be supplied to the substrate in this sense as well in a case in which a part of the cleaning solution is used for lubricating the bearing part as in the aspect disclosed in Patent Document 1. On the centrally, it is possible to solve such a problem when the aspect in which the first supply part 110 that supplies the first liquid into the cleaning member 200 and the second supply part 120 that supplies the second liquid to the bearing part 40 are included is employed.

When the aspect in which the bearing part 40 has two or more bearing members 41 provided in the axial direction and the second supply part 120 supplies the second liquid between the bearing members 41 in the axial direction as illustrated in FIG. 5 is employed, it is possible to supply the second liquid between the bearing members 41 and to supply the second liquid to the respective bearing members 41 located on both sides in the axial direction.

When the aspect in which the holding part 100 has the reservoir part 83 for storing the second liquid is employed (see FIG. 5), it is possible to supply moisture to the bearing part 40 made of SiC or the like with the stored second liquid. That is, it is possible to supply the moisture generated through volatilization of the stored second liquid to the bearing part 40 in addition to the second liquid supplied from the upper side and to effectively lubricate the bearing part 40 by the holding part 100 storing the second liquid. Also, the second liquid is likely to flow to the side of the reservoir part 83, and it is possible to prevent the second liquid from leaking out of the holding part 100 to the side of the substrates W by providing such a reservoir part 83.

When the aspect in which the discharge part 90 that has the discharge port 91 for discharging the second liquid is provided at the case body 80 of the holding part 100, the height position of the discharge port 91 is higher than the lowermost surface of the inner circumferential bottom surface of the case body 80, and the reservoir part 83 is formed between the lowermost surface of the inner circumferential bottom surface and the discharge port 91 in the height direction is employed, it is possible to store the second liquid with the inner circumferential bottom surface of the holding part 100 up to the height at which the second liquid is discharged from the discharge port 91.

When the aspect in which the gap between the case body 80 and the outer member 10 on the lower side is greater than the gap on the upper side is employed in regard to the space between the case body 80 outside the outer member 10 and the outer member 10, it becomes easy to guide the second liquid downward due to a relationship of pressures applied to the second liquid, and it is possible to prevent the second liquid from flowing to an unexpected location and thus to prevent the second liquid from leaking out of the holding part 100 and dropping to the substrates W.

When the aspect in which the second supply part 120 has the adjustment part 125 for adjusting the flow rate as illustrated in FIG. 1 is employed, it is possible to control the amount of second liquid to be supplied to the bearing part 40 with the control part such as the overall control part 350. In addition, the first liquid and the second liquid may be supplied at the same timing or may be supplied at different timings. When the first supply part 110 does not supply the first liquid into the cleaning member 200, for example, the second supply part 120 may supply the second liquid to the bearing part 40. In this case, it is also possible to supply the first liquid only when treatment such as substrate cleaning is performed on the substrates W and/or only when the cleaning member 200 is cleaned, for example, while the second liquid is continuously supplied to constantly wet the bearing part 40, and it is possible to efficiently perform cleaning of the substrates W and/or the cleaning member 200 and lubrication of the bearing part 40.

When the aspect in which the circumferential edge outer end of the tightly closed part 50 is located further outward at the circumferential edge than the circumferential edge outer end of the bearing ball 48 as illustrated in FIG. 9(*b*) is employed, it is possible to prevent the second liquid supplied to the bearing part 40 from leaking to the side of the substrate W via the bearing ball 48. In a case in which the second liquid is supplied between the bearing members 41, the tightly closed part 50 may be provided between the bearing member 41 on the side of the cleaning member 200 and the cleaning member 200, and the tightly closed part 50 for the bearing member 41 on the side opposite to the cleaning member 200 may not be provided as illustrated in FIG. 5.

When the aspect in which the tightly closed part 50 has the first tightly closed part 51 provided with the first notch 52 and the second tightly closed part 56 provided with the second notch 57 as illustrated in FIG. 8(*a*) to FIG. 8(*c*) is employed, it is possible to easily attach the first tightly closed part 51 and the second tightly closed part 56. In regard to the first tightly closed part 51, it is possible to easily attach the first tightly closed part 51 to the circumferential edge outer side of the inner member 20 by spreading the gap of the first notch 52. Also, in regard to the second tightly closed part 56, it is possible to easily attach the second tightly closed part 56 to the circumferential edge outer side of the inner member 20 by spreading the gap of the second notch 57.

By positioning the first notch 52 and the second notch 57 such that the first notch 52 and the second notch 57 do not overlap each other when seen in the axial direction as illustrated in FIG. 8(*c*), it is possible to prevent the second liquid from leaking out to the side of the substrates W through the first notch 52 and the second notch 57. Typically, the positions of the first notch 52 and the second notch 57 may be different by 180° when seen in the axial direction. In this case, it is possible to more reliably prevent the second liquid from leaking out of the holding part 100 via the first notch 52 and the second notch 57. In addition, the tightly closed part 50 may be configured of a resin member instead of the elastic member 96 to be durable against chemicals. Since it is significantly difficult to attach the tightly closed part 50 in a case in which the tightly closed part 50 is configured of such a resin member, it is advantageous to employ the tightly closed part 50 that has the notches as in this aspect.

Figure 2:
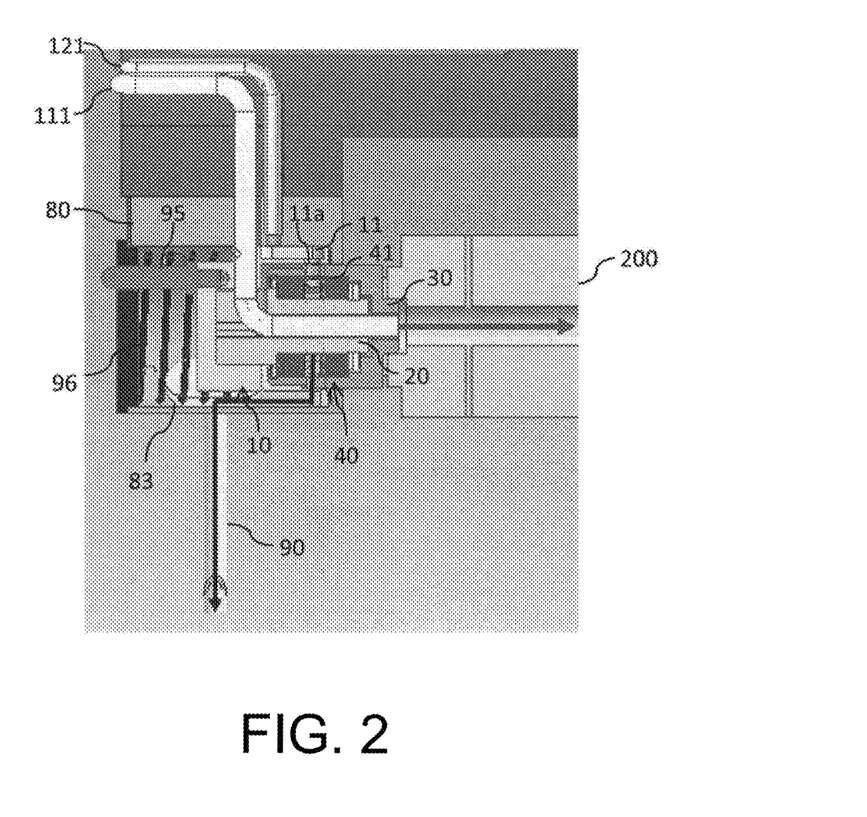
FIG. 2 is a side sectional view illustrating another example of a holding part that can be used in the embodiment of the disclosure and is a side sectional view illustrating flows of a first liquid and a second liquid.

When the aspect in which the first supply pipe 111 extends up to the inside of the rotation part 30 without a joint or the like being provided between the bearing part 40 and the rotation part 30 as illustrated in FIG. 2 is employed, it is possible to supply the first liquid to the cleaning member 200 without reducing the amount of first liquid supplied in the process. As a result, it is possible to supply a predetermined amount of first liquid to the substrates W and to precisely perform substrate treatment such as cleaning of the substrates W.

In addition, when the aspect in which the lower part of the outer member 10 does not cover the hole 31 of the rotation part 30 and is opened as illustrated in FIGS. 3 and 4 is employed, it is possible to prevent a pressure from being applied to the second liquid and to smoothly guide the second liquid to the discharge port 91.

In a case in which the rotation part 30 has the one or more holes 31 for supplying the second liquid to the bearing part 40 as illustrated in FIG. 6, it is possible to supply the second liquid to the bearing part 40 via the holes 31 by the rotation part 30 rotating. The number of holes 31 may be a plural number, and the plurality of holes 31 may be provided at equal intervals. According to such an aspect, it is possible to uniformly supply the second liquid to the bearing part 40 and to efficiently lubricate the bearing part 40. The number of holes 31 is eight to sixteen, for example, and is typically twelve. The diameter of each hole 31 is about 3 mm. Although it is possible to provide the second liquid to the bearing part 40 at shorter intervals as the number of holes 31 increases, an excessively large number of holes 31 may weaken the strength of the rotation part 30. In this regard, it is advantageous to set the number of holes 31 to eight to sixteen.

In a case in which a securing part 95 such as a securing bar for securing the outer member 10 is provided at the case body 80 as illustrated in FIG. 2 and the like, it is possible to prevent the outer member 10 from vibrating due to rotation of the rotation part 30 and to prevent the first supply pipe 111 from being worn out as a result.

The number of cleaning members 200 may be a plural number, and the holding part 100 may be provided at each of the cleaning members 200. For example, an aspect in which the cleaning members 200 are provided both above and below the substrates W (for both front surfaces and rear surfaces of the substrates W) and the holding part 100 is provided for each cleaning member 200 may be employed.

According to an embodiment of the disclosure, a substrate cleaning device may include: a holding part that has a bearing part configured to rotatably hold a cleaning member for cleaning a substrate; a first supply part that has at least a part provided inside the holding part and supplies a first liquid into the cleaning member through the inside of the holding part; and a second supply part that supplies a second liquid to the bearing part.

In the substrate cleaning device according to the disclosure, the bearing part may have two or more bearing members provided in an axial direction, and the second supply part may supply the second liquid between the bearing members in the axial direction.

In the substrate cleaning device according to the disclosure, the holding part may have a reservoir part for storing the second liquid.

In the substrate cleaning device according to the disclosure, the holding part may be provided with a discharge part that has a discharge port for discharging the second liquid, and a height position of the discharge port may be higher than a lowermost surface of an inner circumferential bottom surface of the holding part, and the reservoir part may be formed between the lowermost surface of the inner circumferential bottom surface and the discharge port in a height direction.

In the substrate cleaning device according to the disclosure, the second supply part may have an adjustment part that adjusts the flow rate.

In the substrate cleaning device according to the disclosure, the holding part may have a rotation part that rotates along with the cleaning member and a tightly closed part that is provided to face the bearing part, an outer circumference of the bearing part may abut on the rotation part, the bearing part may have a bearing ball, and in a plane with a normal line in the axial direction, a circumferential edge outer end of the tightly closed part may be located further outward at a circumferential edge than a circumferential edge outer end of the bearing ball.

In the substrate cleaning device according to the disclosure, the holding part may have a rotation part that rotates along with the cleaning member and a tightly closed part provided to face the bearing part, the tightly closed part may have a first tightly closed part provided with a first notch and a second tightly closed part provided with a second notch, and the first notch and the second notch may not overlap when seen in the axial direction.

In the substrate cleaning device according to the disclosure, the holding part may have a rotation part that rotates along with the cleaning member, the first supply part may have a first supply pipe that supplies the first liquid into the cleaning member, and the first supply pipe may extend up to inside of the rotation part without being disconnected at a gap between the bearing part and the rotation part.

In the substrate cleaning device according to the disclosure, the second supply part may supply the second liquid to the bearing part even when the first supply part does not supply the first liquid into the cleaning member.

In the substrate cleaning device according to the disclosure, the holding part may have a rotation part that rotates along with the cleaning member and is provided with one or more holes for supplying the second liquid to the bearing part.

When the aspect in which the first supply part configured to supply the first liquid into the cleaning member and the second supply part configured to supply the second liquid to the bearing part are included is employed, it is possible to supply a constant amount of first liquid and to lubricate the bearing part with the second liquid.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A substrate cleaning device comprising:
a holding part that has a bearing part configured to rotatably hold a cleaning member for cleaning a substrate;
a first supply part that has at least a part provided inside the holding part and supplies a first liquid into the cleaning member through the inside of the holding part; and
a second supply part that supplies a second liquid to the bearing part,
wherein the holding part has a reservoir part for storing the second liquid,
wherein the holding part is provided with a discharge part that has a discharge port for discharging the second liquid, and
a height position of the discharge port is higher than a lowermost surface of an inner circumferential bottom surface of the holding part, and the reservoir part is formed between the lowermost surface of the inner circumferential bottom surface and the discharge port in a height direction.

2. The substrate cleaning device according to claim 1, wherein the bearing part has two or more bearing members provided in an axial direction of the cleaning member, and
the second supply part supplies the second liquid between the bearing members in the axial direction.

3. The substrate cleaning device according to claim 1, wherein the second supply part has an adjustment part that adjusts the flow rate.

4. The substrate cleaning device according to claim 1, wherein the holding part has a rotation part that rotates along with the cleaning member and a tightly closed part that is provided to face the bearing part,
an outer circumference of the bearing part abuts on the rotation part,
the bearing part has a bearing ball, and
in a plane with a normal line in an axial direction of the cleaning member, a circumferential edge outer end of the tightly closed part is located further outward at the circumferential edge than a circumferential edge outer end of the bearing ball.

5. The substrate cleaning device according to claim 1, wherein the holding part has a rotation part that rotates along with the cleaning member,
the first supply part has a first supply pipe that supplies the first liquid into the cleaning member, and
the first supply pipe extends up to inside of the rotation part without being disconnected at a gap between the bearing part and the rotation part.

6. The substrate cleaning device according to claim 1, wherein the second supply part supplies the second liquid to the bearing part even when the first supply part does not supply the first liquid into the cleaning member.

7. The substrate cleaning device according to claim 1, wherein the holding part has a rotation part that rotates along with the cleaning member and is provided with one or more holes for supplying the second liquid to the bearing part.

8. A substrate cleaning device comprising:
a holding part that has a bearing part configured to rotatably hold a cleaning member for cleaning a substrate;
a first supply part that has at least a part provided inside the holding part and supplies a first liquid into the cleaning member through the inside of the holding part; and
a second supply part that supplies a second liquid to the bearing part,
wherein the holding part has a rotation part that rotates along with the cleaning member and a tightly closed part provided to face the bearing part,
the tightly closed part has a first tightly closed part provided with a first notch and a second tightly closed part provided with a second notch, and
the first notch and the second notch do not overlap when seen in an axial direction of the cleaning member.

* * * * *